United States Patent [19]

Swanson

[11] Patent Number: 4,933,022

[45] Date of Patent: Jun. 12, 1990

[54] SOLAR CELL HAVING INTERDIGITATED CONTACTS AND INTERNAL BYPASS DIODES

[75] Inventor: Richard M. Swanson, Los Altos, Calif.

[73] Assignee: Board of Trustees of the Leland Stanford Univ. & Electric Power Research Institute, Palo Alto, Calif.

[21] Appl. No.: 272,105

[22] Filed: Nov. 14, 1988

[51] Int. Cl.$^5$ .................... H01L 27/14; H01L 31/06
[52] U.S. Cl. ................................. 136/249; 136/255; 136/244
[58] Field of Search ......... 136/255, 256, 244, 249 MS

[56] References Cited

U.S. PATENT DOCUMENTS

| 4,166,918 | 9/1979 | Nostrand et al. | 136/243 |
| 4,167,015 | 9/1979 | Hanak | 357/16 |
| 4,227,942 | 10/1980 | Hall | 136/255 |
| 4,239,810 | 12/1980 | Alameddine et al. | 437/2 |
| 4,323,719 | 4/1982 | Green | 136/249 |
| 4,347,264 | 8/1982 | Lindmayer | 430/314 |
| 4,367,368 | 1/1983 | Wolf | 136/255 |
| 4,463,216 | 7/1984 | Nakano et al. | 136/256 |
| 4,512,073 | 4/1985 | Hsu | 437/187 |
| 4,533,933 | 8/1985 | Pellegrini et al. | 357/15 |
| 4,557,037 | 12/1985 | Hanoka et al. | 437/2 |
| 4,585,492 | 4/1986 | Weinberg et al. | 437/247 |
| 4,612,698 | 9/1986 | Gonsioranski et al. | 437/2 |
| 4,640,001 | 2/1987 | Koiwai et al. | 437/2 |
| 4,665,277 | 5/1987 | Sah et al. | 136/255 |
| 4,667,060 | 5/1987 | Spitzer | 136/255 |

OTHER PUBLICATIONS

R. M. Swanson et al., "Point-Contact Silicon Solar Cells", *IEEE Transactions on Electron Devices*, vol. ED-31, No. 5, May 1984, pp. 661-664.
"Point-Contact Silicon Solar Cells", Interim Report, Stanford University, May 1983, EPRI AP-2589 Project 769-2.
W. D. Eades et al., "Densified Deposited Oxide Films for Surface Passivation", *Journal of the Electrochemical Society*, vol. 131, No. 12, Dec. 1984, pp. 3018-3020.
R. M. Swanson, "Point-Contact Solar Cells: Modeling and Experiment", *Solar Cells*, vol. 17, 85-118 (1986).
R. A. Sinton et al., "Silicon Point Contact Concentrator Solar Cells", *IEEE Electron Device Letters*, vol. EDL-6, No. 8, Aug. 1985, pp. 405-407.
R. A. Sinton et al., "27.5-Percent Silicon Concentrator Solar Cells", *IEEE Electron Device Letters*, vol. EDL-7, No. 10, Oct. 1986, pp. 563-568.
R. A. Sinton, "Device Physics and Characterization of Silicon Point-Contact Solar Cells", Feb. 1987, EPRI RP 790-2.

*Primary Examiner*—Aaron Weisstuch
*Attorney, Agent, or Firm*—Flehr, Hohbach, Test, Albritton & Herbert

[57] ABSTRACT

A solar cell structure having dual metal layer contacts or interdigitated metal contact fingers on one surface is provided with internal bypass diodes in each cell. Each bypass diode comprises doped regions in contact with the metal spaced from the doped regions of the active solar cell. The doped regions of the bypass diodes are of opposite conductivity type from the doped regions of the active solar cell for each contact. The bypass diode is spaced from the active region and is shaded from irradiation during normal operation.

3 Claims, 1 Drawing Sheet

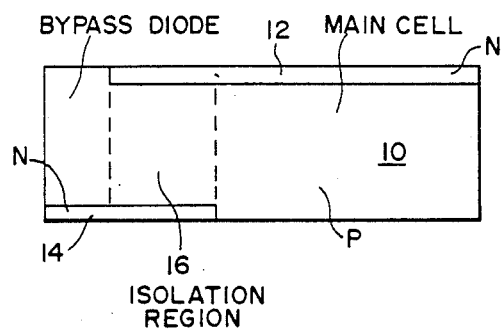
(PRIOR ART)
FIG.—1A
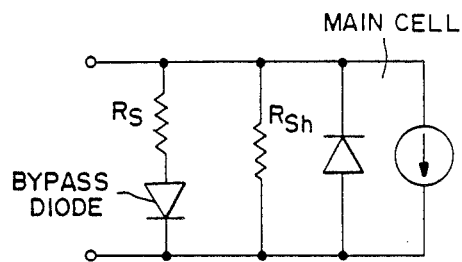
(PRIOR ART)
FIG.—1B
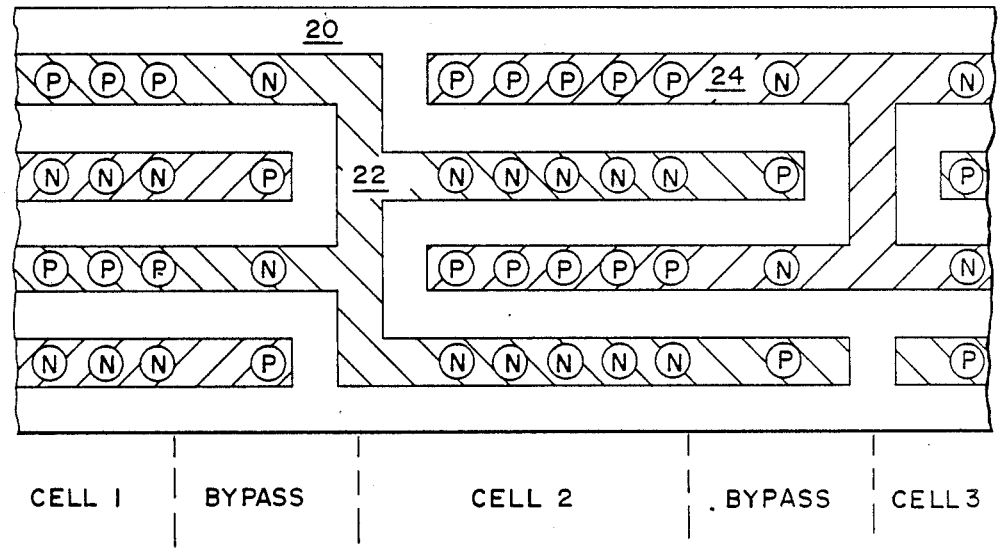
FIG.—2A
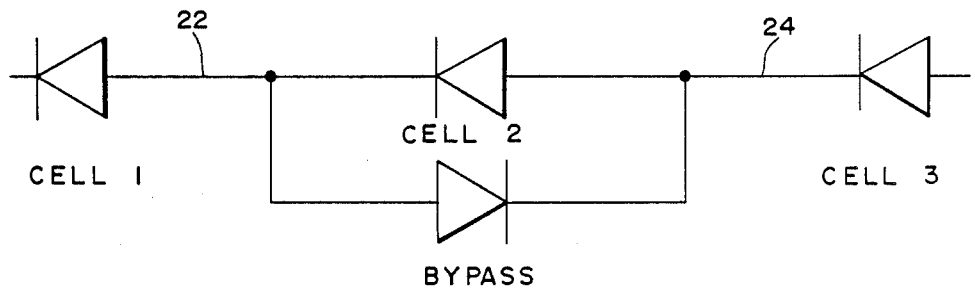
FIG.—2B

SOLAR CELL HAVING INTERDIGITATED CONTACTS AND INTERNAL BYPASS DIODES

BACKGROUND OF THE INVENTION

This application is related to copending application Ser. No. 272,129 pending for "Monolithic Series-Connected Solar Cells Employing Shorted P-N Junctions For Electrical Isolation" and to copending application Serial No. 272130 pending for "Method of Fabricating Back Surface Point Contact Solar Cells."

This invention relates generally to silicon solar cells having interdigitated back contacts, and more particularly the invention relates to such solar cells having internal bypass diodes.

The silicon solar cell comprises a plurality of p and n conductivity type regions in a silicon body which generate a voltage potential and/or a current when electron-hole pairs are created in the semiconductor body in response to impinging radiation, and the holes and electrons migrate to the p-doped regions and the n-doped regions, respectively. In a solar cell having interdigitated back surface contacts, the p and n regions are formed in alternating rows with a metal contact provided for contacting all of the doped regions in one row and with all rows of like dopant regions being connected in parallel.

It is recognized that partial shading of solar cell modules can cause a disproportionate loss in module output or local overheating and module destruction. See Green et al., "Silicon Solar Cells with Integral Bypass Diodes," *Conference Record, 17th IEEE Photovoltaic Special Conference*, May 1-4, 1984. A shaded cell causes a drop in module current, and the drop in current increases the operating voltage of the unshaded cells. The extra voltage generated drives down the voltage across the shaded cell in an attempt to increase the current through it. With even small amounts of shading, the shaded cell will become reverse-biased and become a dissipator of electrical power. One technique used to overcome the problem is the provision of bypass diodes connected across groups of cells. This limits the power dissipation in the shaded cell to the maximum generating capacity of the remainder of the cells in a group.

Green et al. propose a silicon solar cell structure with integral bypass diodes incorporated in the cell structure. The main cell comprises a p-n junction formed by an n region in one surface of a p-type substrate. The bypass diode comprises an n region in the opposing surface of the p-type substrate and laterally displaced from the main cell. The semiconductor body portion between the main cell and the bypass diode provides electrical isolation between the cell and the diode. The technique does require an additional processing step, and the resistance of the semiconductor body provides limited isolation unless treated to increase the resistance thereof.

SUMMARY OF THE INVENTION

An object of the present invention is an improved silicon solar cell having interdigitated back contacts and integral bypass diodes.

Another object of the invention is a method of providing a silicon solar cell with integral bypass diodes without requiring additional processing steps.

A feature of the invention is the provision of bypass diodes in electrical contact with the integral contacts in shaded portions of the solar cell near the serial interconnection of adjacent cells.

Briefly, in accordance with the invention a plurality of cells is formed in one surface of a silicon substrate with each cell having alternate rows of p-type and n-type regions formed in the surface. A first metal contact structure contacts all p-type regions and a second metal contact structure contacts all n-type regions. The first and second metal structures serially connect the cell with adjacent cells. Bypass diodes are formed in each cell with each bypass diode comprising an n-type region contacting the first metal contact and a p-type region contacting the second metal contact, the bypass diodes being located in areas of a cell not irradiated during normal operation of the cell.

The invention and objects and features thereof will be more readily apparent from the following detailed description and appended claims when taken with the drawing.

BRIEF DESCRIPTION OF THE DRAWINGS

FIGS. 1A and 1B are a section view and an equivalent circuit, respectively, of a solar cell and bypass diode in accordance with the prior art.

FIGS. 2A and 2B are a top plan view and a schematic diagram, respectively of a portion of a solar cell structure including bypass diodes in accordance with the present invention.

DETAILED DESCRIPTION OF ILLUSTRATIVE EMBODIMENTS

Referring now to the drawing, FIGS. 1A and 1B are a section view and an equivalent circuit of a silicon solar cell with integral bypass diode as disclosed by Green et al., supra. The cell includes a p-doped substrate 10 with an n-doped surface region 12 in the top surface and functioning as the main cell. An n-doped surface layer 14 is formed in the bottom surface, also, laterally offset from the main cell diffused region 12, and functions with the semiconductor body 10 as the bypass diode. The resistance of region 16 between the bypass diode and the main cell functions as an isolating resistor. The functional block diagram of FIG. 1B shows the bypass diode serially connected with a series resistance, $R_s$, and the main cell shunted by a shunt resistance $R_{sh}$.

As described by Green et al., the bypass diode limits the power dissipation in a shaded cell to the maximum generating capacity of the remainder of the cells in a group of cells shunted by the bypass diode. Thus, in a large array of serially-connected cells, the power dissipation in a shaded cell is limited to the maximum generating capacity of the remainder of cells in the group As further noted by Green et al., the structure of FIG. 1A requires an extra cell processing step in fabricating the solar cell. Additionally, isolation of the bypass diode from the main cell is limited to the resistance of the substrate portion between the bypass diode and the main cell as shown in FIG. 1A. For an acceptable level of isolation, the isolation region must be treated to further increase the resistance.

Consider now FIG. 2A which is a top plan view of a solar cell having interdigitated contacts and internal bypass diodes in accordance with the intention, and FIG. 2B which is a schematic diagram thereof. A portion of cell 1, all of cell 2 along with a bypass diode, and a portion of cell 3 are illustrated in FIG. 2A. The cells are formed in one surface of a high-resistivity silicon substrate 20 by alternating rows of p-doped regions and n-doped regions as illustrated. A first metallization 22 interconnects the n-doped regions in cell 2, and a second metallization 24 interconnects the p-doped regions in cell 2. Metallization 22 interconnects the cathode of cell 2 to the anode of cell 1, whereas the metallization 24 connects the anode of cell 2 with the cathode of cell 3. This is illustrated in the schematic diagram of FIG. 2B. It will be appreciated that each cell could include many more interdigitated conductors with each conductor contacting many more diffused regions in each row.

In accordance with the invention, bypass diodes are formed in remote portions of the interdigitated contacts in each cell by forming diffused regions under the metallization of opposite conductivity type as the diffused regions in the active portion of the cell. For example, metallization 22 in cell 2 contacts n-doped regions in the active portion of the cell, and p-doped regions of the bypass diode Similarly, the metallization 24 contacts p-doped regions of the active cell region and n-doped regions of the bypass diode. A feature of the invention is the utility of the bypass diodes with a high resistivity substrate which limits shunt resistance, whereas the structure of Green et al. necessarily requires a lower resistivity substrate. In normal operation, the bypass diodes are shielded from irradiation and do not conduct current so long as the associated active cell region is generating a voltage and/or current. However, when the active cells region becomes shaded, then the bypass diode limits the voltage across the cell and bypasses current around the cell. Preferably, the substrate has high resistivity to limit shunt resistance.

The use of internal bypass diodes in a solar cell having interdigitated contacts on a back surface is readily fabricated without modifying the process steps in forming a solar cell array. The bypass diodes electrically isolated from the active region by the spacing of the bypass diode from the active region. The by-pass diodes can function, also, in isolating serially-connected cells as described in copending application Serial No. 272129, supra. However, the by-pass diodes will function with a single cell as well as in serially-connected cells.

While the invention has been described with reference to a solar cell using interdigerated back contacts, the invention can be used with a solar cell having a dual-layer metal interconnect structure. Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A solar cell structure comprising
   a substrate of silicone, and
   a plurality of cells T formed in one surface of said substrate, each cell having alternate rows of p-type and n-type regions formed in said one surface, a first metal contact structure contacting all p-type regions and a second metal contact structure contacting all n-type regions, said first and second metal contact structures serially connecting a cell with adjacent cells, and a bypass diode formed in each cell each bypass diode comprising an n-type region contacting said first metal contact and a p-type region contacting said second metal contact, said bypass diodes being located in areas of cells not irradiated during normal operation of the cell.

2. The solar cell structure as defined by claim 1 wherein said first and second metal contact structures each contact opposite conductivity-type regions in adjacent cells.

3. In solar cell structure having a plurality of metal contacts with at least a first metal contact contacting doped regions of a first conductivity type in an active portion of the cell and at least a second metal contact contacting doped regions of opposite conductivity type in said active portion of the cell, a bypass diode comprising at least one doped region of first conductivity type in electrical contact with said second meal contact and at least one doped region of said opposite conductivity type contacting said first meal contact, said first and second metal contacts being interdigitated, and said bypass diode being spaced from the doped regions of the active cell.

* * * * *